US007002733B2

(12) United States Patent
Dagenais et al.

(10) Patent No.: US 7,002,733 B2
(45) Date of Patent: Feb. 21, 2006

(54) METHODS AND DEVICES FOR AMPLIFYING OPTICAL SIGNALS USING A DEPOLARIZER

(75) Inventors: Mario Dagenais, Chevy Chase, MD (US); Stewart W Wilson, Silver Spring, MD (US); Anthony W. Yu, Spencerville, MD (US); Peter J. S. Heim, Washington, DC (US)

(73) Assignee: Quantum Photonics, Inc., Jessup, MD (US)

( * ) Notice: Subject to any disclaimer, the term of this patent is extended or adjusted under 35 U.S.C. 154(b) by 299 days.

(21) Appl. No.: 10/353,984

(22) Filed: Jan. 30, 2003

(65) Prior Publication Data

US 2004/0150876 A1 Aug. 5, 2004

(51) Int. Cl.
*H04B 10/12* (2006.01)
*H01S 3/00* (2006.01)

(52) U.S. Cl. ...................................... 359/337; 359/344

(58) Field of Classification Search ................ 359/337, 359/344

See application file for complete search history.

(56) References Cited

U.S. PATENT DOCUMENTS 4,923,291 A * 5/1990 Edagawa et al. ........... 359/334
5,309,530 A * 5/1994 Bergano et al. ................ 385/1
5,309,535 A * 5/1994 Bergano et al. ............... 385/38
5,910,852 A * 6/1999 Fontana et al. ............. 398/185
5,982,531 A 11/1999 Emery et al.
6,205,262 B1 * 3/2001 Shen .......................... 385/11
6,310,720 B1 * 10/2001 Walker et al. ............. 359/344
6,522,796 B1 * 2/2003 Ziari et al. .................... 385/11
6,545,800 B1 * 4/2003 Wilson et al. ........... 359/341.4
6,549,331 B1 * 4/2003 Walker et al. .............. 359/344
6,611,369 B1 * 8/2003 Matsushita et al. ......... 359/334
6,760,151 B1 * 7/2004 Vail et al. ................ 359/341.3
2004/0004755 A1 * 1/2004 Roberts et al. ............. 359/337
2004/0109230 A1 * 6/2004 Matsushita et al. ...... 359/341.3

OTHER PUBLICATIONS

Grosskopf et al., "Optical Amplifier Configurations with Low Polarisation Sensitivity", Electronic Letters, vol. 23, 1987, pp1387-1388.*
CASIX, A JDS Uniphase Company; "Wedge Depolarizer"; web address: http://www.casix.com/news/depolarizer.htm.
"Optical Amplifier Configurations with Low Polarisation Sensitivity;" Electronic Letters, vol. 23, 1987, pp. 1387-1388, United States.
Frank Jung and Kevin Shirk, Lightwave, "Depolarizers enjoy increasing demand in long-haul and EDFA markets: Users must Assess the Applicability of various depolarizer types and address the issues of each;" web address: http://lightwave.archives.com.
Edited by S. Shimada and H. Ishio; "Optical Amplifiers and Their Applications;" Chapter 4; 1994; pp. 70-72; John Wiley & Sons; New York, New York, United States.

* cited by examiner

*Primary Examiner*—Jack Keith
*Assistant Examiner*—Eric Bolda
(74) *Attorney, Agent, or Firm*—Potomac Patent Group PLLC

(57) ABSTRACT

An optical amplification device includes a depolarizer for reducing the polarization sensitivity requirements on an SOA by changing the input to the SOA from having an arbitrary (unknown) polarization state to a known (depolarized) state. The depolarizer receives an input optical signal and outputs a depolarized, optical signal, and a semiconductor optical amplifier (SOA) receives the depolarized optical signal and outputs an amplified optical signal.

33 Claims, 11 Drawing Sheets

METHODS AND DEVICES FOR AMPLIFYING OPTICAL SIGNALS USING A DEPOLARIZER

BACKGROUND

The present invention relates generally to amplification of optical signals and, more particularly, to methods and devices for minimizing the polarization dependent gain in optical amplifiers by amplifying optical signals using a depolarizer in conjunction with a semiconductor optical amplifier (SOA).

Technologies associated with the communication of information have evolved rapidly over the last several decades. Optical information communication technologies have evolved as the technology of choice for backbone information communication systems due to, among other things, their ability to provide large bandwidth, fast transmission speeds and high channel quality. Semiconductor lasers and optical amplifiers are used in many aspects of optical communication systems, for example to generate optical carriers in optical transceivers and to generate optically amplified signals in optical transmission systems. Among other things, optical amplifiers are used to compensate for the attenuation of optical data signals transmitted over long distances.

There are several different types of optical amplifiers being used in today's optical communication systems. In erbium-doped fiber amplifiers (EDFAs) and Raman amplifiers, the optical fiber itself acts as a gain medium that transfers energy from pump lasers to the optical data signal traveling therethrough. In semiconductor optical amplifiers (SOAs), an electrical current is used to pump the active region of a semiconductor device. The optical signal is input to the SOA from the optical fiber where it experiences gain due to stimulated emission as it passes through the active region of the SOA.

Like other devices employed in optical networks, SOAs suffer from polarization sensitivity. That is, the gain experienced by a light beam that is input to a conventional SOA will vary depending upon the polarization state of the input optical energy. In this context, the polarization state of a light beam is typically described by the orthogonal polarization components referred to as transverse electric (TE) and transverse magnetic (TM). Unfortunately, even if light having a known (e.g., linear) polarization state is injected into a typical optical fiber (i.e., a single mode fiber), after propagation through the optical fiber the light will become elliptically polarized. This means that the light input to SOAs placed along the optical fiber will have TE and TM polarization components of unknown magnitude and phase, resulting in the gain applied by SOAs also varying indeterminately as a function of the polarization state of the input light.

There are various techniques that have been employed to compensate for the polarization dependent gain that is introduced by SOAs. One such technique, shown in FIG. 1, is to arrange two SOAs in series. In amplifier 10, the gain for TE mode light is greater than the gain for TM mode light. Amplifier 12 has the same structure as amplifier 10 but is rotated by 90 degrees so that the gain for TM mode light is greater than the gain for TE mode light, i.e., in reverse proportion to the polarization gain ratio for amplifier 10. In this way, the optical energy output from the combination of amplifiers 10 and 12 is substantially polarization independent. This technique can also be practiced by arranging the SOAs in parallel as described, for example, in the textbook *Optical Amplifiers and their Applications*, edited by S. Shimada and H. Ishio, published by John Wiley & Sons, Chapter 4, pp. 70–72, the disclosure of which is incorporated here by reference. Another technique for compensating for polarization dependent gain is to use some other corrective device downstream of the SOA as shown in FIG. 2. For example, a variable polarization dependent loss control device 22 can be disposed downstream of the SOA 20 to compensate for unequal magnitudes of TE and TM gain. This technique is described in U.S. Pat. No. 6,310,720, the disclosure of which is incorporated here by reference. Both of these techniques suffer from, among other things, the drawback of requiring a number of additional components to create a single polarization insensitive SOA, thereby increasing the cost of the solution.

Attempts have also been made to provide an integrated solution to this problem, i.e., to design polarization insensitive SOAs. One such attempt is described in U.S. Pat. No. 5,982,531 to Emery et al., the disclosure of which is incorporated here by reference. Therein, the active material in the SOA is subjected to a tensile strain sufficient to render the amplifier insensitive to the polarization of the light to be amplified. However, balancing the TE/TM gain using such techniques requires extremely accurate control over device geometry, layer thickness, layer composition and background absorption loss. In practice, this level of control is very difficult to achieve in a repeatable manufacturing process, i.e., there may be a significant variance in the polarization sensitivity of SOAs manufactured using such techniques from one manufacturing run to another.

Accordingly, Applicants would like to provide methods and devices that amplify optical signals in a manner which is relatively polarization insensitive, but which also facilitates manufacturing repeatability for amplification devices and, therefore, is cost effective.

SUMMARY

Systems and methods according to the present invention address this need and others by providing optical amplification devices that combine depolarizers with SOAs. According to exemplary embodiments of the present invention, the use of a depolarizer in optical amplification devices reduces the polarization sensitivity requirements on the SOA by changing the input to the SOA from having an arbitrary polarization state to a uniform spatial distribution of linearly polarized states.

According to an exemplary embodiment an optical amplification device includes a depolarizer for receiving an input optical signal and outputting a depolarized, optical signal, and a semiconductor optical amplifier (SOA) for receiving the depolarized optical signal and outputting an amplified optical signal.

BRIEF DESCRIPTION OF THE DRAWINGS

The accompanying drawings illustrate exemplary embodiments of the present invention, wherein.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

As described in the Background, conventional techniques for addressing polarization dependent gain in SOAs involved attempts to make the SOAs themselves operate in a more polarization independent manner or to provide corrective devices downstream of the SOA to compensate for the polarization dependent gain introduced by the SOA. The present invention takes a different approach. Devices and methods according to exemplary embodiments of the present invention modify the optical signal which is input to the SOA so that the polarization dependent gain characteristics of the SOA are less pronounced. Specifically, by providing a depolarizer at the input to an SOA, the gain characteristics at the output of the SOA will be relatively polarization independent even if the SOA itself is only "quasi" polarization independent. As that phrase is used in the present specification, "quasi" polarization independent SOAs provide a difference between TE and TM gain of more than 1 dB and, preferably, 1–5 dB. Conversely, SOAs which are substantially polarization independent provide a difference between TE and TM gain of less than 1 dB and, preferably, less than 0.5 dB. For the interested reader, Applicants have described a substantially polarization independent SOA in their copending U.S. patent application Ser. No. 10/323,630, entitled "A Semiconductor Optical Amplifier with Low Polarization Gain Dependency", filed on Dec. 20, 2002, the disclosure of which is hereby incorporated by reference. However, in the present application, the ability to employ a quasi polarization independent SOA in the amplification device, and still provide gain performance which is similar to a substantially polarization independent SOA, is expected to confer substantial cost savings due to the relaxation of the polarization performance requirements on the SOA.

Figure 1:
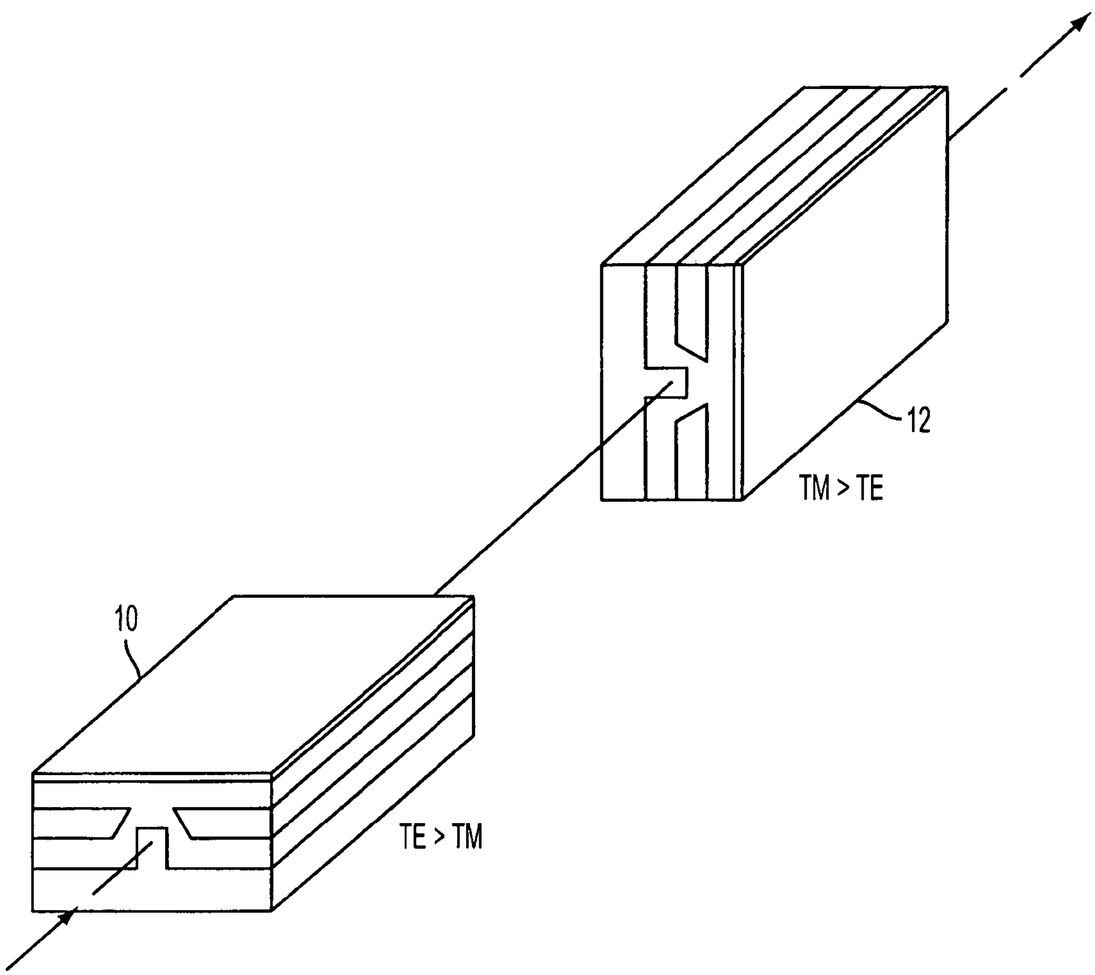
FIG. 1 depicts a conventional technique for compensating for polarization dependent gain of SOAs by employing two SOAs in series.
Figure 2:
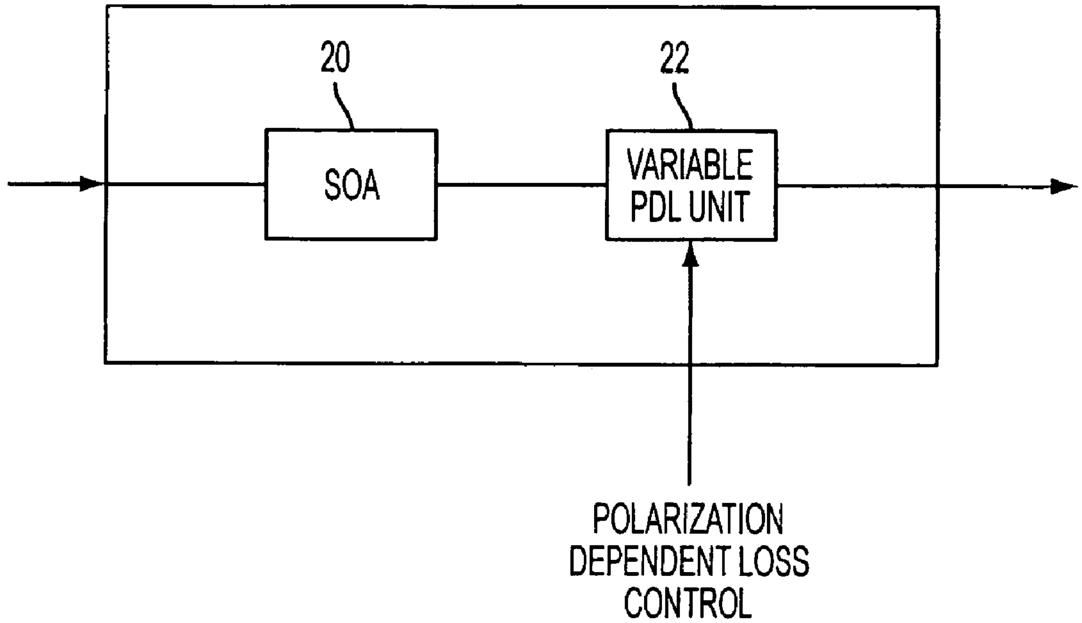
FIG. 2 depicts another conventional technique involving employing a downstream corrective device that adjusts the gain.
Figure 3:
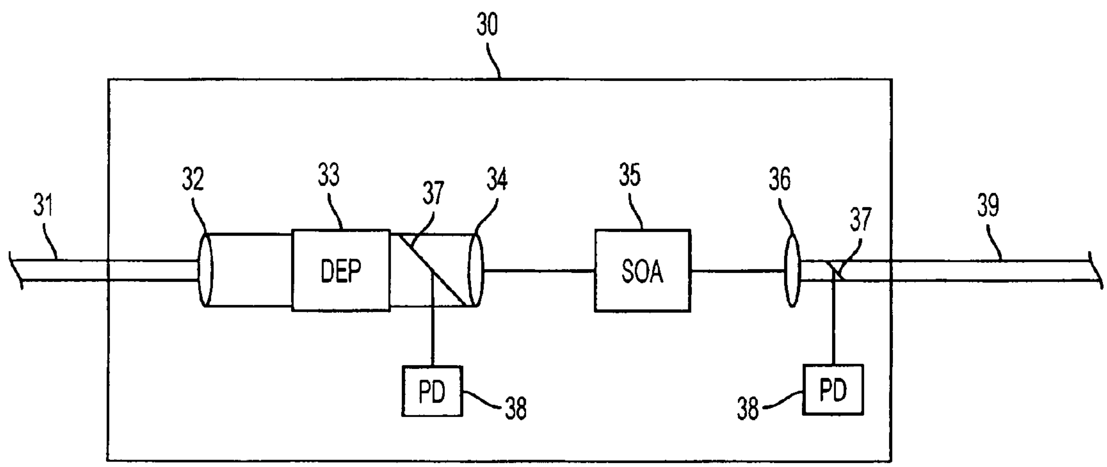
FIG. 3 depicts an optical amplification device according to an exemplary embodiment of the present invention.
Figure 4:
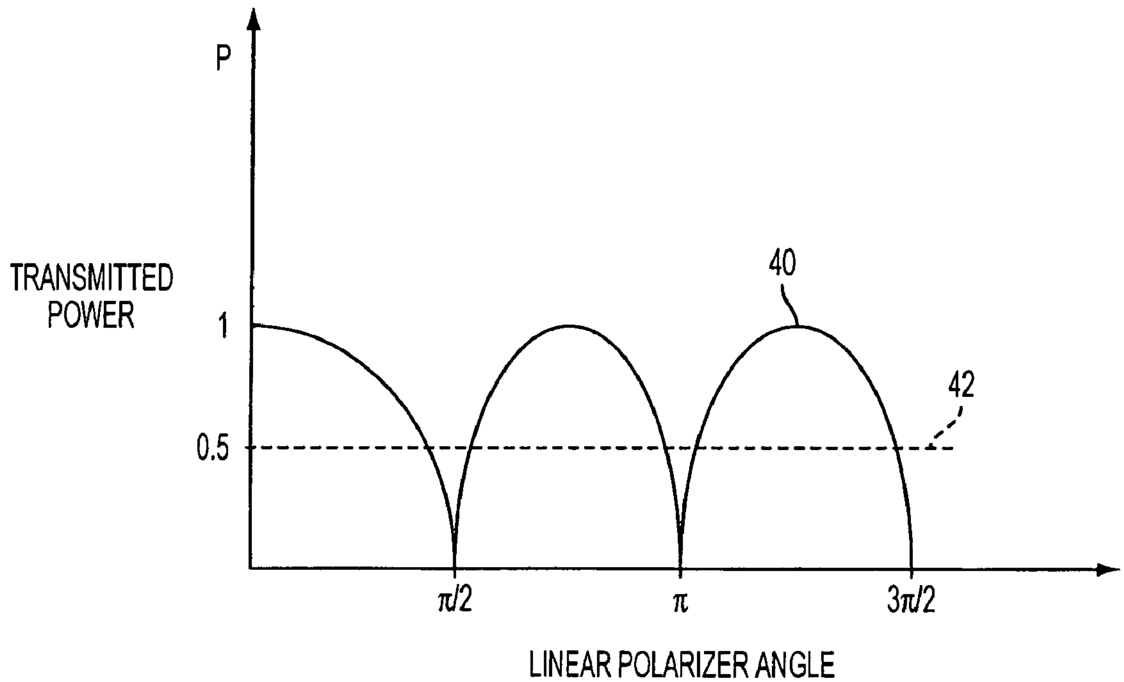
FIG. 4 is a graph illustrating the effect of the depolarizer on a linearly polarized input beam.

FIG. 3 depicts an optical amplification device 30 according to an exemplary embodiment of the present invention. Therein, an input optical signal arrives at the optical amplification device 30 via an optical fiber 31. This input optical signal has an arbitrary (elliptical) polarization. A collimating lens 32 can be provided in the optical amplification device 30 to spread out the input optical signal for application to the depolarizer 33. Depolarizer 33 takes the input optical signal and generates a depolarized optical signal. Those skilled in the art will appreciate that an ideally depolarized optical signal is a light beam having a uniform distribution of all of the linear states of polarization across the light beam. The presence of a depolarized light beam can be determined by, for example, rotating a linear polarizer through the beam and observing that transmission of the beam through the polarizer is the same for all angles of the linear polarizer. This characteristic is illustrated in FIG. 4. Therein, the solid line 40 depicts the optical power measured as a function of the linear polarizer angle for an input optical signal which has a linear polarization, e.g., primarily TE or TM polarized light. The optical power varies from a peak magnitude of 1 to a magnitude of zero depending upon which angle of the polarizer is used to measure the transmitted signal through the linear polarizer. By way of contrast, the ideally depolarized optical signal (represented by dashed line 42) has a constant optical power regardless of the angle of the linear polarizer relative to the input optical signal. In practice, the depolarizer 33 will not have the ideal transmission characteristics shown in FIG. 4. For the purposes of the present invention, however, it is desirable that the depolarized optical signal has a distribution of polarization states which is independent of the polarization state of the input optical signal. Thus, for the present specification, the phrase "depolarized optical signal" refers to both ideally depolarized optical signals and optical signals which are less than ideally depolarized.

Figure 5A:
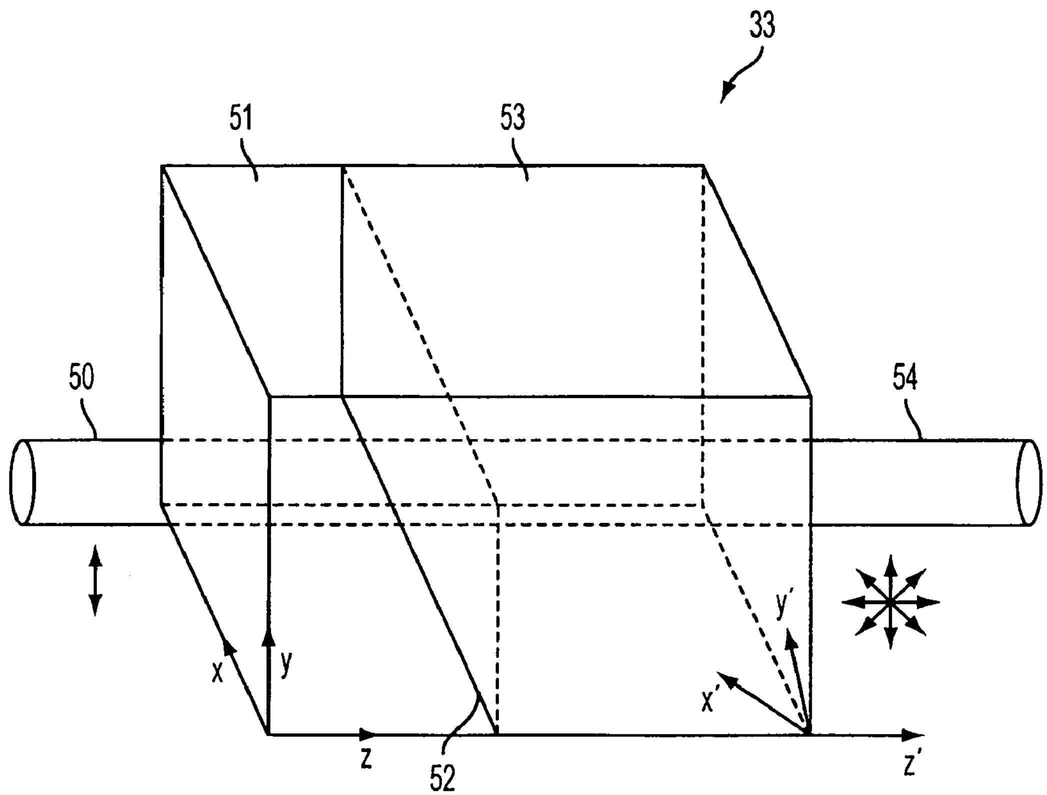
FIG. 5(*a*) shows an exemplary spatial depolarizer and FIG. 5(*b*) depicts transmission characteristics associated with this exemplary spatial depolarizer
Figure 5B:
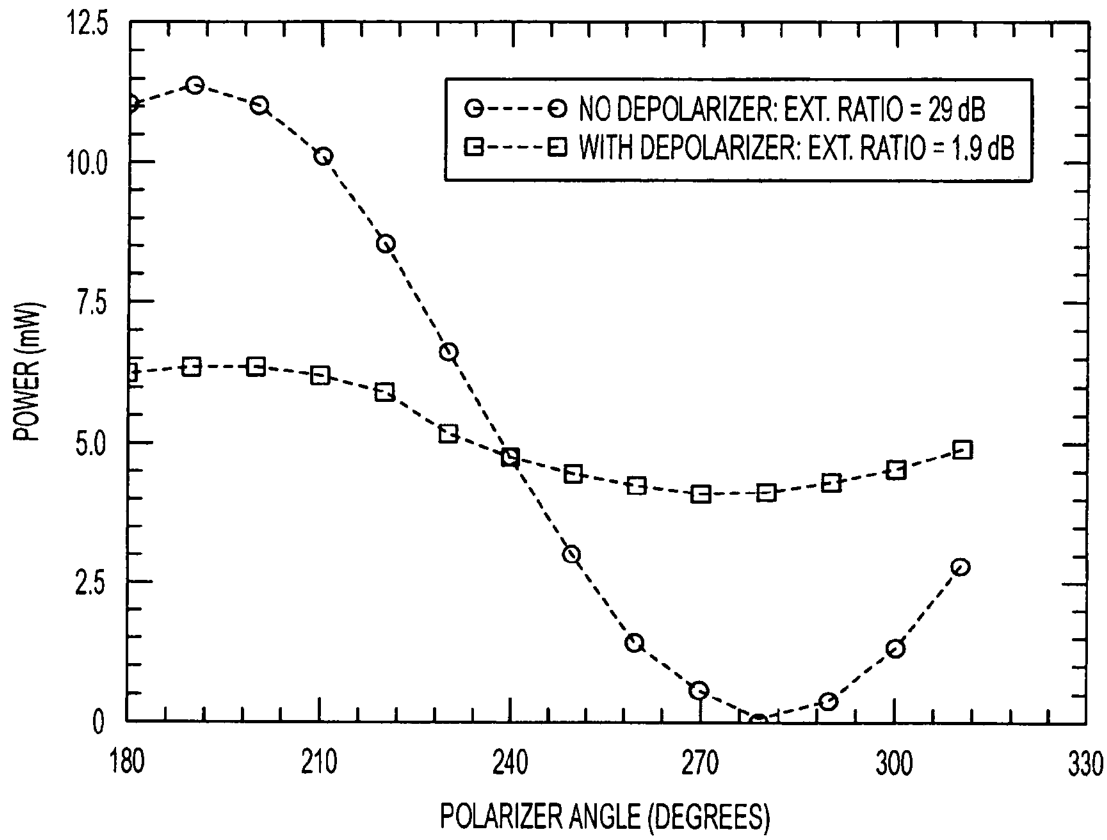

There are many types of depolarizers which can be used to implement depolarizer 36 33 in optical amplification devices according to the present invention. For example, spectral depolarizers, time domain depolarizers (e.g., electro-optical modulators or recirculating loop depolarizers) and spatial depolarizers can all be used as depolarizer 33. However, Applicants currently prefer the latter type of depolarizer due to its ability to handle fast data rates and to depolarize optical signals over narrow spectral bandwidths. An example of a dual wedge spatial depolarizer 33 is shown in FIG. 5(*a*). The dual wedge 33 can, for example, be cut from a birefringent, crystalline material such as quartz and has two wedge sections 51 and 53. The optic axis in both wedge sections 51 and 53 is perpendicular to the propagation of the incoming beam. However, the optic axis in the wedge section 53 is offset by 45 degrees from the optic axis in the wedge section 51. FIG. 5(*a*) depicts one example of this relationship, where the optic axes y and y' (of wedge sections 51 and 53, respectively) are offset by 45 degrees. Since the depolarizer takes the shape of a wedge at the interface 52, the incoming beam experiences different optical path lengths, and therefore different polarization rotation, across the aperture of the outgoing beam 54. As a result an incoming beam having a particular (arbitrary) polarization state does not retain this polarization state, and the outgoing beam contains a number of different polarization states which are spatially averaged together. An example of a dual wedge depolarizer which can be used to fabricate optical amplification devices according to the present invention is the Wedge Depolarizer manufactured by Fujian JDSU/CASIX, Inc. As mentioned above, depolarizers are typically not ideal. Applicants have tested this particular depolarizer and plotted (FIG. 5(*b*)) its transmission characteristics as measured through a linear polarizer. Moreover, this type of depolarizer typically outputs two additional optical beams (not shown) at an angle relative to the incident beam. The significance of this effect can be minimized by keeping this angle small with respect to the incident beam diffraction angle. For the exemplary Wedge Depolarizer manufactured by Fujian JDSU/CASIX, Applicants have found that this can be accomplished by providing, as an input to the optical amplification device according to the present invention, an optical input signal having a spot beam diameter size of 500 microns or less. Other wedge depolarizers may permit larger spot beams while also sufficiently restricting divergence between the two additional beams and the primary optical output.

Returning to FIG. 3, the depolarized optical signal can then be output to a lens 34 for focusing the depolarized optical signal onto an SOA 35. The SOA 35 amplifies the depolarized optical signal to provide a predetermined amount of gain thereto. As mentioned above, the SOA 35 can be only quasi polarization independent, i.e., having a difference between TE and TM gain of more than 1 dB and, preferably, 1–5 dB. Alternatively, polarization sensitive SOAs, i.e, those having a difference between TE and TM gain of more than 5 dB, can be used, however a noise figure penalty of up to 3 dB may then be incurred by the optical amplification device. Any type of SOA can be used in optical amplification device 30, e.g., having one or more gain sections of ridge or buried type, using quantum well or bulk materials. The resulting amplified optical signal can then be applied to a collimating/focusing lens 36 prior to being output from the optical amplification device 30 via optical fiber 39. Also shown in FIG. 3 are two beam splitters 37 and photodiodes 38. These elements may optionally be included in the optical amplification device 30 to provide information regarding the operation of the SOA 35. Specifically, by diverting a portion of the optical energy which is input to the SOA 35 and a portion of the optical energy which is output from the SOA 35 onto photodiodes 38, information regarding the SOA's performance (i.e., gain performance) can be provided to external monitoring circuitry (not shown). Those skilled in the art will appreciate that optical amplification devices according to the present invention may also include additional components not shown in FIG. 3. For example, an optical isolator (not shown) could be disposed between collimating lens 32 and depolarizer 33 and/or between collimating/focusing lens 36 and beam splitter 37 to prevent reflections from outside device 30 from creating undesired lasing modes.

Figure 6:
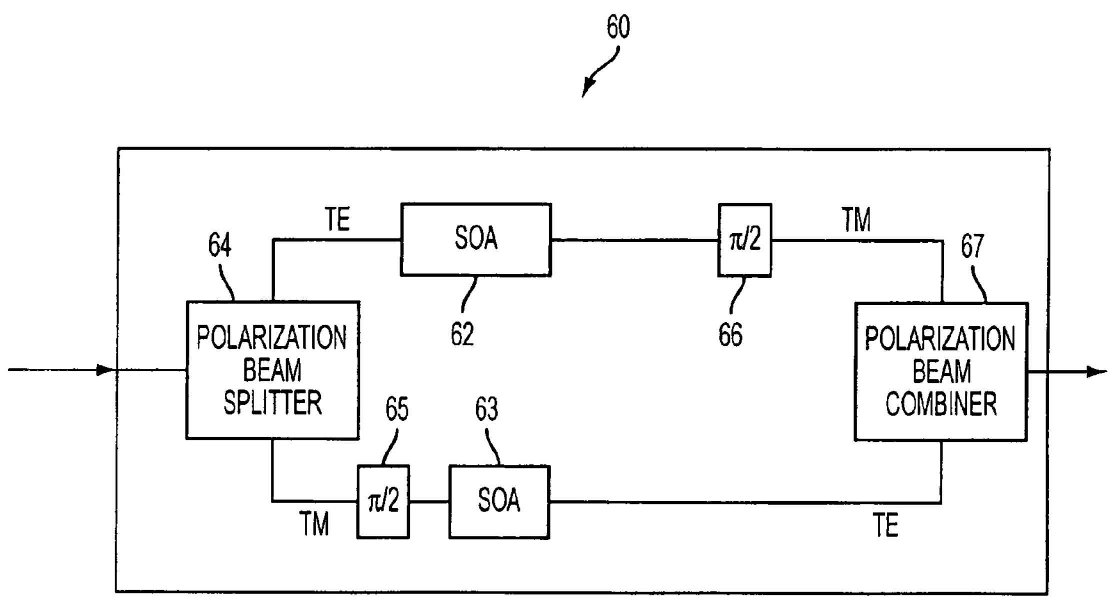
FIG. 6 depicts a conventional optical amplification device employing two polarization dependent SOAs.

Whereas the exemplary embodiment of FIG. 3 employs a quasi polarization independent SOA 35 in optical amplification device 30, according to another exemplary embodiment of the present invention, two polarization dependent SOAs can instead be used in optical amplification devices. Consider the conventional optical amplification device depicted in FIG. 6, wherein both of the polarization dependent SOAs 62 and 63 only amplify optical energy having a TE polarization. Therein, an input optical signal having arbitrary (elliptical) polarization is received at optical amplification device 60 and split into its component TE and TM polarizations by polarization beam splitter 64. The TE light is directed toward SOA 62 and the TM light is directed toward SOA 63. The TM light is rotated by 90 degrees ($\pi/2$) by rotation unit 65, e.g., using a $\lambda/2$ plate or a Faraday rotator, to transform the TM light into TE light prior to amplification by SOA 63. The amplified output from SOA 62 is rotated by 90 degrees by rotation unit 66. Polarization rotation units 65 and 66 can be implemented as microoptical components or using fiber based components. The TE and TM light beams are then recombined by polarization beam combiner 67. This configuration uses the two polarization dependent SOAs in an offsetting manner to create a polarization insensitive amplification device 60. As long as the optical power of the input optical signal is low (i.e., below the saturation powers of SOAs 62 and 63), this amplification device 60 is insensitive to the polarization of the input optical signal as long as the gain of SOA 62 is equal to the gain of SOA 63. If, however, the optical power of the input optical signal is higher (i.e., comparable to or greater than the saturation powers of SOAs 62 and 63), then the output power of optical amplification device 60 can be sensitive to the state of polarization of the input optical signal.

Figure 7:
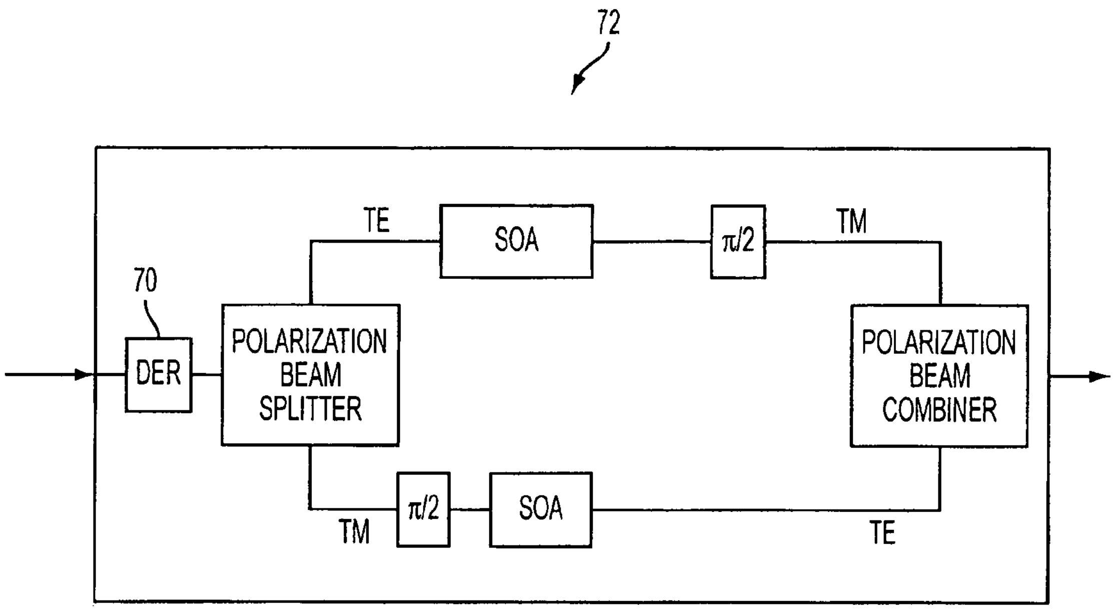
FIG. 7 depicts an optical amplification device according to another exemplary embodiment of the present invention employing two polarization dependent SOAs and a depolarizer upstream of a polarization beam splitter.

Thus, according to another exemplary embodiment of the present invention shown in FIG. 7, a depolarizer 70 is placed upstream of the polarization beam splitter 64 in an optical amplification device 72. By depolarizing the input optical signal prior to splitting it into TE and TM polarizations, approximately half of the optical energy from the input optical signal will be directed to SOA 62 and the other approximately half of the optical energy from the input optical signal will be directed to SOA 63 regardless of the polarization state of the incoming optical signal. This effectively increases the saturation powers of the optical amplification device 72 relative to optical amplification device 60 by approximately 3 dB, since the architecture of optical amplification device 72 ensures an even distribution of optical power between the two branches. Compare this result with that obtained by the conventional architecture of FIG. 6, wherein it is possible for all of the optical power to pass through one of the branches. Moreover, since polarization dependent SOAs 62 and 63 (e.g., compressively strained or unstrained SOAs) typically have a saturation power of about 3 dB higher than individual, tensile strained, polarization independent SOAs the optical amplification device 72 may have a saturation power which is as much as 6 dB higher than single, tensile strained, polarization independent SOAs.

This same technique, depolarizing the input optical signal of the optical amplification device, can be employed in a number of different configurations. Two examples are provided in FIGS. 8 and 9. In the exemplary embodiment of FIG. 8, the optical input signal is provided to a depolarizer 82 and then to an optical circulator 84. The output of the circulator 84 is provided to a polarization beam splitter 86, which separates the optical energy into its TE and TM components. The TM component travels through the upper branch to polarization rotation device 88 which transforms the optical energy into TE light. This TE light then passes through the SOA 89, which can be a polarization sensitive SOA, and is then returned to the polarization beam splitter/combiner 86. Similarly, the TE light from polarization beam splitter/combiner 88 travels the lower branch through the SOA 89 and then to polarization rotation device 88 where it is transformed into TM light. The amplified TE and TM light returning from SOA 89 is then combined in unit 86 and forwarded to circulator 84 for output.

Figure 8:
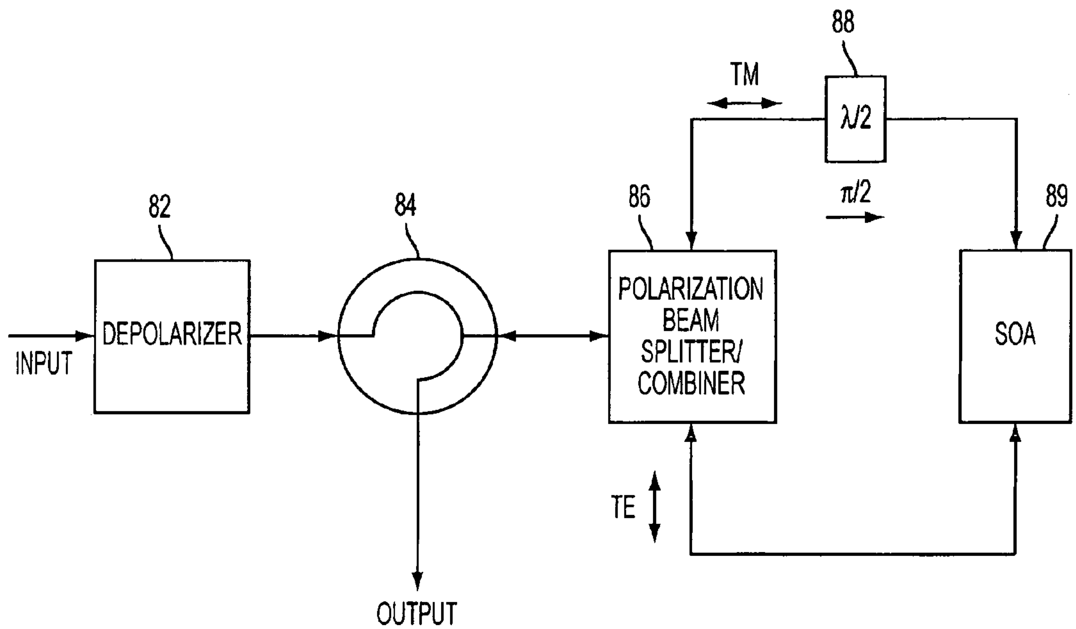
FIG. 8 shows an optical amplification device according to yet another exemplary embodiment of the present invention.
Figure 9:
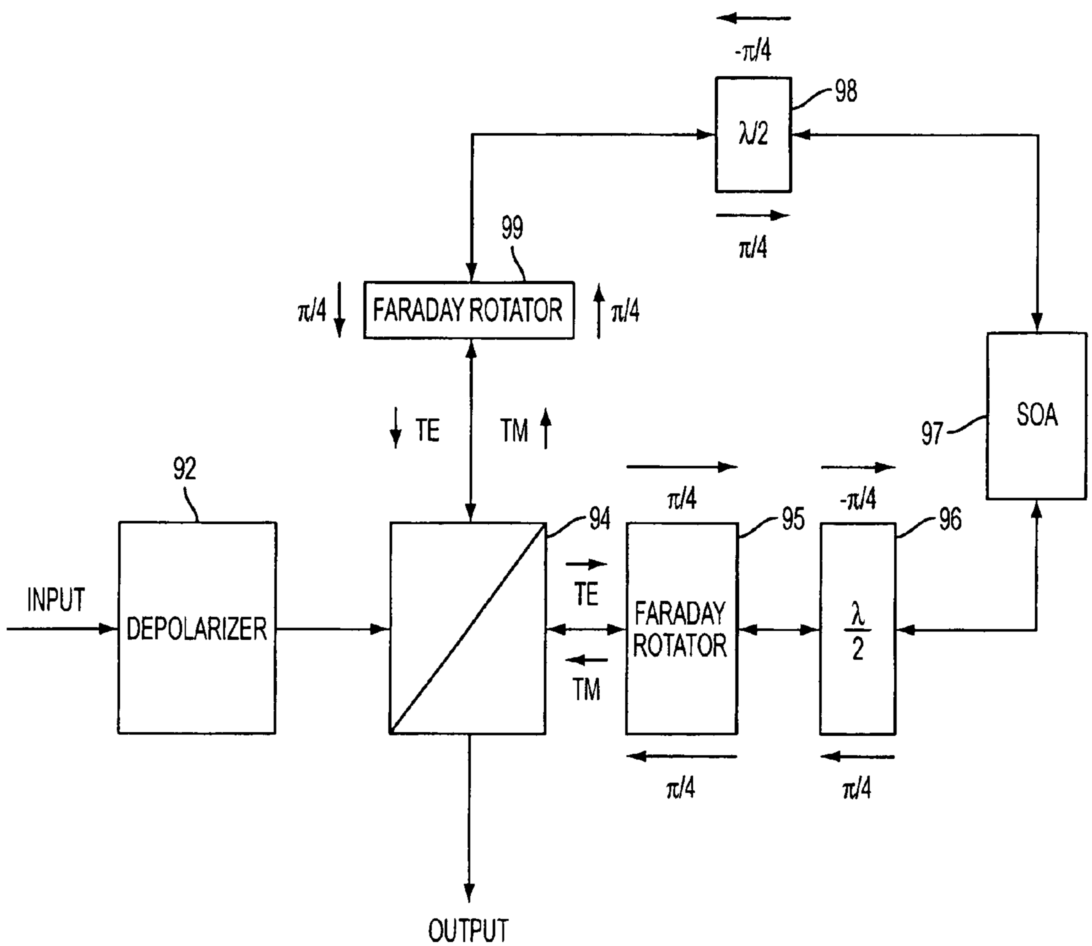
FIG. 9 shows an optical amplification device according to a still further exemplary embodiment of the present invention.

In FIG. 9, a similar arrangement is show's employing a beam splitter in place of the circulator and polarization beam splitter/combiner of FIG. 8. A depolarizer 92 is again disposed at the input to depolarize an incoming optical signal. The depolarized optical signal is then forwarded to the beam splitter 94 which selectively reflects or transmits light based upon its polarization state. For example, TE light is passed through into the lower branch of FIG. 9, while TM light is reflected along the upper branch. The light then circulates through the various polarization rotation units 95, 96, 98 and 99 and through the SOA 98 for amplification. More specifically, and starting in the counterclockwise direction of propagation through the loop, the TE light passes to Faraday rotator 95 where it receives a polarization rotation of π/4. Continuing on to λ/2 plate 96, the light receives a −π/4 rotation, i.e., the rotation provided by polarization unit 95 is undone by polarization unit 96 such that TE polarized light is input to SOA 97. After amplification, the light passes to another λ/2 plate 98 where it receives a polarization rotation of −π/4, which polarization rotation is again undone by Faraday rotator 99. The amplified TE light enters the beam splitter 94 and passes through to the output. Thus in the counterclockwise direction, polarization rotation units 95, 96, 98 and 99 have the effect of maintaining the light in the TE polarization state. In the clockwise direction, on the other hand, TM light is rotated by π/4 at Faraday rotator 99 and again by π/4 by λ/2 plate 98 so that this portion of the optical signal has a TE polarization state prior to entering SOA 97. Then, the amplified output is converted back into TM polarized light by passage through λ/2 plate 96 and Faraday rotator 95, such that it will be reflected to the output upon its return to beam splitter 94. Note that λ/2 plates 96 and 98 can be implemented as fiber components, e.g., using twisted portions of polarization maintaining fiber.

The aforedescribed exemplary embodiments of the present invention refer to implementations wherein the depolarizer is packaged together with the SOA and associated elements, e.g., co-located on a common substrate with each component disposed within 10 centimeters of an adjacent component. Another characteristic of optical amplification packages according to exemplary embodiment of the present invention is that within each package the optical path between the components is unguided (free space), whereas connections between packages can, for example, be made using optical fiber. However, according to other exemplary embodiments, it may be desirable to provide two individual packages containing the depolarizer and the SOA, respectively, which packages are linked by an optical fiber of, e.g., less than one meter in length. This configuration may simplify manufacturing of optical amplification devices according to the present invention.

Figure 10:
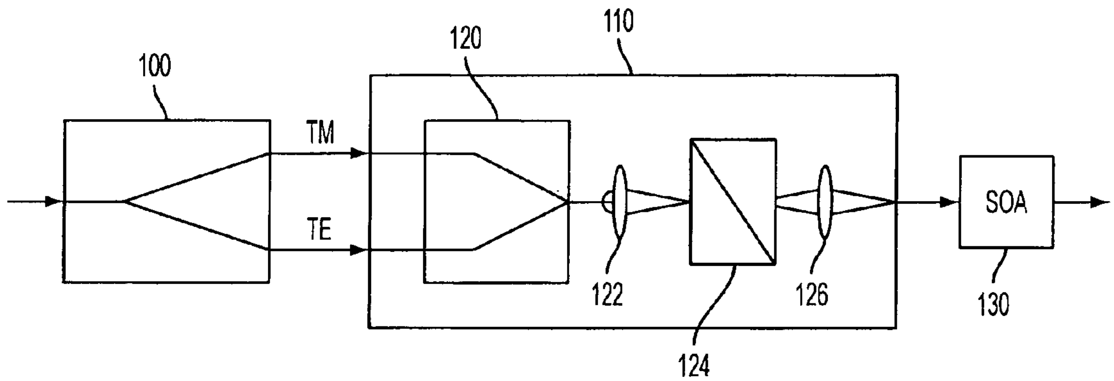
FIG. 10 depicts an optical amplification device according to another exemplary embodiment of the present invention.

According to yet another exemplary embodiment of the present invention, depicted in FIG. 10, an input optical signal can first be provided to a fiber polarization beam splitter 100. The fiber polarization beam splitter 100 separates the TM and TE light components for input to package 110. Package 110 includes a fiber polarization combiner 120 which recombines the TM and TE components. The light is then passed through a focusing lens 122 prior to being input to depolarizer 124. Depolarizer 124 can, for example, be composed of one crystal quartz wedge and one fused silica wedge, as compared with the double crystal wedge depolarizers described above. The depolarized output is focused by lens 126 prior to being input to SOA 130. SOA 130 can be a quasi-polarization sensitive independent SOA, i.e., one in which the difference between the gain applied to TE optical energy differs from the gain applied to TM optical energy by 1–5 dB.

The above-described exemplary embodiments are intended to be illustrative in all respects, rather than restrictive, of the present invention. Thus the present invention is capable of many variations in detailed implementation that can be derived from the description contained herein by a person skilled in the art. For example, although the foregoing exemplary embodiments illustrate some of the advantages of employing a depolarizer in tandem with an SOA, similar techniques can be used with other devices which are sensitive to the polarization state of the incoming optical signal, e.g., optical modulators. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. An optical amplification device comprising:
- a depolarizer for receiving an input optical signal and outputting a depolarized, optical signal;
- at least one semiconductor optical amplifier (SOA) for receiving said depolarized optical signal and outputting an amplified optical signal, wherein said at least one SOA includes two amplifier stages, each of said two amplifier stages having a polarization dependent gain associated therewith;
- a polarization beam splitter for splitting said depolarized optical signal into a TM polarization component and a TE polarization component;
- a first polarization rotator for rotating said TM polarization component, wherein one of said two SOAs amplifier stages receives said rotated TM polarization component and one of said two amplifier stages receives said TE polarization component;
- a second polarization rotator for rotating an output of said one of said two amplifier stages that receives said TE polarization component; and
- a polarization beam combiner, for combining an output of said second polarization rotator and said one of said two amplifier stages that receives said rotated TM polarization component, to generate said amplified output signal.

2. The optical amplification device of claim 1, wherein said depolarizer is a spatial depolarizer.

3. The optical amplification device of claim 2 wherein said spatial depolarizer is a dual wedge device fabricated from crystal.

4. The optical amplification device of claim 2, wherein said spatial depolarizer includes a single crystal wedge.

5. The optical amplification device of claim 4 further comprising:
- a polarization beam splitter and a polarization beam combiner disposed upstream of said spatial depolarizer.

6. The optical amplification device of claim 1, wherein said input optical signal has an arbitrary polarization.

7. The optical amplification device of claim 6, wherein said input optical signal has a non-uniform distribution of linear polarization states.

8. The optical amplification device of claim 1, wherein said depolarized, optical signal has a substantially uniform distribution of linear polarization states.

9. The optical amplification device of claim 1, further comprising:
- a collimating lens for collimating said input optical signal onto said depolarizer.

10. The optical amplification device of claim 1, further comprising:
- a focusing lens for focusing said depolarized optical signal onto said at least one SOA.

11. The optical amplification device of claim 1, wherein said input optical signal is one of a modulated signal and an unmodulated signal.

12. The optical amplification device of claim 1, further comprising:
- a first beam splitter for diverting a portion of said depolarized optical signal to a first photodiode.

13. The optical amplification device of claim 12, further comprising a second beam splitter for diverting a portion of said amplified optical signal to a second photodiode.

14. The optical amplification device of claim 1, wherein said depolarizer and said at least one SOA are disposed in the same package.

15. The optical amplification device of claim 1, wherein said depolarizer and said at least one SOA are disposed in separate packages linked together by a length of optical fiber.

16. An optical amplification device comprising:

a depolarizer for receiving an input optical signal and outputting a depolarized, optical signal; and at least one semiconductor optical amplifier (SOA) for receiving said depolarized optical signal and outputting an amplified optical signal, wherein said at least one SOA includes one amplifier stage having a gain associated therewith, said gain having a transverse electric (TE) component and a transverse magnetic (TM) component, a difference between said TE component and said TM component being at least one dB;

a circulator for receiving said depolarized optical signal at a first port and outputting said depolarized optical signal at a second port;

a polarization beam splitter/combiner for receiving said depolarized optical signal from said circulator and splitting said depolarized optical signal into a TM polarization component and a TE polarization component;

a polarization rotator for rotating said TM polarization component;

wherein said single SOA receives said rotated TM polarization component and said TE polarization component and outputs an amplified TM polarization component and an amplified TE polarization component;

wherein said amplified TE component returns through said polarization rotator to said polarization beam splitter/combiner and is combined with said amplified TM polarization component to generate said amplified optical signal; and wherein said amplified optical signal is returned to said second port of said circulator and output through a third port of said circulator.

17. An optical amplification device comprising:

a depolarizer for receiving an input optical signal and outputting a depolarized. optical signal; and at least one semiconductor optical amplifier (SOA) for receiving said depolarized optical signal and outputting an amplified optical signal, wherein said at least one SOA includes one amplifier stage having a gain associated therewith, said gain having a transverse electric (TE) component and a transverse magnetic (TM) component, a difference between said TE component and said TM component being at least one dB;

a beam splitter for receiving said depolarized optical signal from said depolarizer and splitting said depolarized optical signal into a TM polarization component and a TE polarization component;

a plurality of polarization rotation devices for receiving said TE and TM polarization components of said optical signal, respectively, and rotating a polarization associated therewith;

wherein said single SOA receives said rotated TE and TM polarization components and outputs amplified TE and TM components;

wherein said beam splitter receives said amplified TE and TM components and outputs these components as said amplified optical signal.

18. A method for amplifying an input optical signal comprising the steps of:

depolarizing said input optical signal; and amplifying said depolarized optical signal using at least one semiconductor optical amplifier (SOA);

providing that said at least one SOA includes one amplifier stage having a gain associated therewith, said gain having a transverse electric (TE) component and a transverse magnetic (TM) component, a difference between said TE component and said TM component being at least one dB;

receiving said depolarized optical signal at a first circulator port and outputting said depolarized optical signal at a second circulator port;

splitting said depolarized optical signal from said second circulator port into a TM polarization component and a TE polarization component;

rotating said TM polarization component;

receiving, at said single SOA, said rotated TM polarization component and said TE polarization component and outputting an amplified TM polarization component and an amplified TE polarization component;

returning said amplified TE component through said polarization rotator to said polarization beam splitter/combiner and combining said rotated, amplified TE component with said amplified TM polarization component to generate said amplified optical signal; and returning said amplified optical signal to said second circulator port and outputting said amplified optical signal through a third circulator port.

19. A method for amplifying an input optical signal comprising the steps of:

depolarizing said input optical signal; and amplifying said depolarized optical signal using at least one semiconductor optical amplifier (SOA);

providing that said at least one SOA includes one amplifier stage having a gain associated therewith, said gain having a transverse electric (TE) component and a transverse magnetic (TM) component, a difference between said TE component and said TM component being at least one dB;

receiving, at a beam splitter, depolarized optical signal from said depolarizer and splitting said depolarized optical signal into a TM polarization component and a TE polarization component;

polarization rotating said TE and TM polarization components of said optical signal;

receiving, at said single SOA, said rotated TE and TM polarization components and outputting amplified TE and TM components;

receiving, at said beam splitter, said amplified TE and TM components and outputting these components as said amplified optical signal.

20. A method for amplifying an input optical signal comprising the steps of:

depolarizing said input optical signal; and amplifying said depolarized optical signal using at least one semiconductor optical amplifier (SOA);

providing that said at least one SOA includes two amplifier stages, each of said two amplifier stages having a polarization dependent gain associated therewith;

splitting said depolarized optical signal into a TM polarization component and a TE polarization component;

rotating said TM polarization component, wherein one of said two SOAs receives said rotated TM polarization component and one of said two SOAs receives said TE polarization component;

rotating an output of said one of said two SOAs that receives said TE polarization component; and combining an output of said second polarization rotator and said one of said two SOAs that receives said rotated TM polarization component, to generate said amplified output signal.

21. The method of claim 20, wherein said step of depolarizing further comprises the step of:

using a spatial depolarizer to depolarize said input optical signal.

22. The method of claim 21, wherein said spatial depolarizer includes a single crystal wedge.

23. The method of claim 22, further comprising the steps of:

polarization beam splitting said optical input signal into component polarizations; and polarization combining said component polarizations prior to said step of depolarizing.

24. The method of claim 20, wherein said input optical signal has a non-uniform distribution of linear polarization states.

25. The method of claim 20, wherein said depolarized, optical signal has a substantially uniform distribution of linear polarization states.

26. The method of claim 20, further comprising the step of:

collimating said input optical signal onto said depolarizer.

27. The method of claim 20, further comprising the step of:

focusing said depolarized optical signal onto said at least one SOA.

28. The method of claim 20, wherein said input optical signal is one of a modulated signal and an unmodulated signal.

29. The method of claim 20, further comprising the step of:

diverting a portion of said depolarized optical signal to a first photodiode.

30. The method of claim 29, further comprising the step of:

diverting a portion of said amplified optical signal to a second photodiode.

31. The method of claim 20, further comprising the step of:

providing said depolarizer and said at least one SOA in the same package.

32. The method of claim 20, further comprising the step of:

providing said depolarizer and said at least one SOA in separate packages linked together by a length of optical fiber.

33. The optical amplification device of claim 20, wherein said spatial depolarizer is a dual wedge device fabricated from crystal.

* * * * *